(12) United States Patent
Rissing et al.

(10) Patent No.: US 10,627,262 B2
(45) Date of Patent: Apr. 21, 2020

(54) SENSOR UNIT FOR POSITION MEASUREMENT

(71) Applicant: DR. JOHANNES HEIDENHAIN GmbH, Traunreut (DE)

(72) Inventors: Lutz Rissing, Munich (DE); Martin Sterkel, Prien (DE)

(73) Assignee: DR. JOHANNES HEIDENHAIN GMBH, Traunreut (DE)

( * ) Notice: Subject to any disclaimer, the term of this patent is extended or adjusted under 35 U.S.C. 154(b) by 49 days.

(21) Appl. No.: 15/968,457

(22) Filed: May 1, 2018

(65) Prior Publication Data

US 2018/0321061 A1 Nov. 8, 2018

(30) Foreign Application Priority Data

May 3, 2017 (EP) ..................................... 17169204

(51) Int. Cl.
| | |
|---|---|
| *G01D 5/347* | (2006.01) |
| *G01D 11/24* | (2006.01) |
| *G01D 5/14* | (2006.01) |
| *H05K 1/18* | (2006.01) |
| *H05K 5/04* | (2006.01) |

(52) U.S. Cl.
CPC ........... *G01D 5/34715* (2013.01); *G01D 5/14* (2013.01); *G01D 5/3473* (2013.01); *G01D 5/34746* (2013.01); *G01D 11/245* (2013.01); *H05K 1/181* (2013.01); *H05K 5/04* (2013.01); *H05K 2201/10113* (2013.01); *H05K 2201/10121* (2013.01); *H05K 2201/10151* (2013.01)

(58) Field of Classification Search
None
See application file for complete search history.

(56) References Cited

U.S. PATENT DOCUMENTS

| | | | |
|---|---|---|---|
| 5,995,229 A | 11/1999 | Omi | |
| 2002/0000512 A1* | 1/2002 | Thaler | G01D 5/3473 250/231.13 |
| 2004/0212051 A1* | 10/2004 | Zhao | H01L 23/13 257/672 |
| 2005/0218313 A1* | 10/2005 | Kuroda | G01D 5/34707 250/231.13 |

(Continued)

FOREIGN PATENT DOCUMENTS

| | | |
|---|---|---|
| DE | 19843155 A1 | 4/1999 |
| DE | 102013206689 A1 | 10/2014 |

(Continued)

*Primary Examiner* — Shawn Decenzo
(74) *Attorney, Agent, or Firm* — Hunton Andrews Kurth LLP

(57) ABSTRACT

A sensor unit for measuring the position of a component that is movable relative to the sensor unit includes a metal body, which has a first opening. An electronic component is arranged in the first opening such that a gap is provided between the electronic component and the metal body, the gap being filled with an electrically insulating molding compound. In addition, an electrically insulating first layer is applied on the electronic component and on the molding compound. The electronic component is electrically contacted with a circuit trace, and the circuit trace is routed through the first layer in a first section and extends on the first layer in a second section.

19 Claims, 4 Drawing Sheets

(56) References Cited

U.S. PATENT DOCUMENTS

| | | | |
|---|---|---|---|
| 2008/0315077 A1* | 12/2008 | Benner | G01D 5/34723 250/231.13 |
| 2009/0122323 A1 | 5/2009 | Schneider | |
| 2009/0211352 A1 | 8/2009 | Hatanaka et al. | |
| 2009/0243060 A1 | 10/2009 | Saitoh | |
| 2010/0165359 A1* | 7/2010 | Hane | G01D 5/34746 356/615 |
| 2012/0001063 A1* | 1/2012 | Horiguchi | G01D 5/34707 250/231.1 |
| 2013/0139589 A1 | 6/2013 | Hoenicka et al. | |
| 2016/0011020 A1* | 1/2016 | Ehrenpfordt | G01D 11/245 73/431 |
| 2016/0209247 A1* | 7/2016 | Nagura | G01D 5/34746 |
| 2017/0261351 A1* | 9/2017 | Nagura | G01D 5/34707 |
| 2017/0284834 A1* | 10/2017 | Odaka | G01D 5/3473 |
| 2017/0307419 A1* | 10/2017 | Tomioka | G01D 5/345 |
| 2017/0339790 A1* | 11/2017 | Wittmann | H05K 1/0204 |
| 2018/0106646 A1* | 4/2018 | Mizutani | G01D 5/34715 |
| 2019/0128706 A1* | 5/2019 | Konishi | G01D 5/347 |

FOREIGN PATENT DOCUMENTS

| | | |
|---|---|---|
| DE | 102015210099 A1 | 8/2016 |
| EP | 2063231 A2 | 5/2009 |
| EP | 2096418 A2 | 9/2009 |
| WO | WO 2011/076181 A2 | 6/2011 |

* cited by examiner

SENSOR UNIT FOR POSITION MEASUREMENT

CROSS-REFERENCE TO RELATED APPLICATIONS

The present application claims priority to application Ser. No. 17/169,204.9, filed in the European Patent Office on May 3, 2017, which is expressly incorporated herein in its entirety by reference thereto.

FIELD OF THE INVENTION

The present invention relates to a sensor unit for position measurement, e.g., for an angle-measuring device or a length-measuring device.

BACKGROUND INFORMATION

For example, angle-measuring devices are used as rotary encoders for determining the angular position of two machine components that are rotatable relative to each other. Additionally, length-measuring devices measure a linear displacement of two machine components that are displaceable relative to each other. Angle-measuring devices as well as length-measuring devices are usually equipped with sensor units which scan components that are movable relative to the sensor units, e.g., angle scales, linear scales, or measuring standards, and generate position-dependent signals.

In the case of optical measuring devices, light sources and photodetectors are often mounted on a circuit board of an optical sensor unit. An optical scale is situated opposite from the circuit board and is set apart by an air gap. Signals are able to be generated as a function of the position, in accordance with, e.g., conventional principles.

Such measuring systems or measuring devices are often used for electrical drives, for the purpose of determining the relative movement or the relative position of corresponding machine components. In such a case, using a corresponding interface system, the generated position values are made available to a subsequent electronics unit for the control of the drives.

German Published Patent Application No. 198 43 155 describes a displacement-measuring device in which the corresponding sensor unit includes an IC chip, which is mounted on a glass substrate in a resin block.

SUMMARY

Example embodiments of the present invention provide a sensor unit that exhibits a robust operating behavior with respect to external influences and is able to be produced in a relatively economical manner.

According to an example embodiment of the present invention, a sensor unit lends itself to measuring the position of a component which is movable in relation to the sensor unit, and the sensor unit includes a metal body that has at least one first opening. Situated in the first opening is at least one electronic component such that a gap is provided between the electronic component and the metal body, the gap being filled with an electrically insulating molding compound. An electrically insulating first layer is applied on the electronic component and on the molding compound. The electronic component is electrically contacted with a circuit trace, which is routed through the first layer in a first section and extends on the first layer in a second section. In particular, the electronic component is directly electrically contacted with the first section of the circuit trace.

Gap S is arranged such that it encircles the electronic component so that the molding compound circumferentially surrounds the electronic component in the opening. More specifically, no direct contact exists between the electronic component and the metal body. Polymer materials such as an epoxy resin but also inorganic adhesives may be used as materials for the molding compound. For example, the molding compound may be introduced using a molding system. However, the molding compound may also be introduced into the gap with the aid of an injection-molding machine using an injection molding method.

In the second section, the circuit trace extends at least partially on the surface of the first layer that faces away from the surface of the metal body. The metallized circuit trace laterally projects beyond the edge of the electronic component.

In this case, the electrical connection of the electronic component is achieved without using wires, etc., and wire bonding, in particular, is able to be omitted.

The electrically insulating first layer may be at least partially also applied on the metal body, and the second section of the circuit trace may extend parallel to a first surface of the metal body.

The electronic component may be arranged as an active component such as an IC chip, or as a passive component such as a resistor.

The electronic component may include at least one optical sensor.

The electronic component may have at least one light source. In particular, the electronic component may be arranged as an IC chip, which includes, for example, the at least one optical sensor and the light source. As an alternative, the light source may be disposed on a first electronic component and the optical sensor on a second electronic component. The first and the second electronic components are situated in one and the same opening in such a configuration, e.g., in the first opening of the metal body.

As an alternative, the electronic component may include at least one magnetic sensor, especially a magnetoresistive sensor or a Hall-effect sensor. The electronic component may include inductive or capacitive sensors.

The metal body may have a first surface, and the electronic component may be disposed in the opening so as to be flush with the first surface. Accordingly, the electronic component is disposed at the same level as first surface and flush with the first surface. The first surface and an external surface of the component are located in one and the same geometrical plane.

In addition, if the electronic component includes at least one optical sensor, the at least one optical sensor may be disposed flush with the first surface. In an electronic component with a plurality of optical sensors, multiple sensors may also be disposed flush with the first surface.

The sensor unit may include a cable provided with a shield, which is connected to the metal body in an electrically conductive manner.

The metal body may have a thickness of more than 0.5 mm, e.g., a thickness of more than 1.0 mm, a thickness of more than 1.5 mm, etc. More specifically, the metal body also has fastening device to mechanically fasten the sensor unit to a machine component. The fastening device may include a borehole through the metal body or a threaded bore. The metal body may thus particularly accommodate not only the electronic component but also simultaneously assume the function of a flange. In addition, the metal body may include a mechanically processed contour, which is able to be used as a reference or as a stop for the precisely fitting affixation on a machine component.

The metal body may have a first surface and a second surface, the second surface being situated opposite from the first surface. The sensor unit may include at least one electronic component, which is disposed such that it projects beyond the second surface and is therefore not situated in a manner flush with respect to the second surface. Alternatively or additionally, the sensor unit may also have at least one cable connection, which is arranged such that it axially projects beyond the second surface.

The metal body may be arranged as a single piece.

The metal body may include a second opening in which a circuit board is arranged, which has a first surface and a second surface located on the opposite side of the first surface. The electrical contacting of the circuit trace with the circuit board takes place at the first surface of the circuit board. In addition, an electronic component is mounted on the second surface of the circuit board. The circuit trace is electrically connected to the component with the aid of a via. The first surface of the circuit board may particularly be disposed parallel to, e.g., flush with, the first surface of the metal body. Alternatively or additionally, the second surface of the circuit board may be situated parallel to the second surface of the metal body.

According to an example embodiment of the present invention, a position-measuring device includes a sensor unit and a component that is movable relative to the sensor unit. The component includes a scale, which may be arranged as an angle scale or as a linear scale and may be configured for incremental or absolute position measurement. The sensor unit is situated opposite from the scale such that the circuit trace is located between the metal body and the scale.

The second section of the circuit trace may extend between the metal body and the scale. Accordingly, the first layer is situated between the metal body and the scale. The term "scale" describes a body that has an incremental or absolute scale graduation and is often also referred to as a measuring standard.

The component of the position-measuring device may be rotatable relative to the sensor unit, and the scale may be arranged as an angle scale. As an alternative, the component is linearly displaceable relative to the sensor unit, and the scale is arranged as a linear scale.

Further features and aspects of example embodiments of the present invention are described in more detail below with reference to the appended Figures.

DETAILED DESCRIPTION

Figure 1:
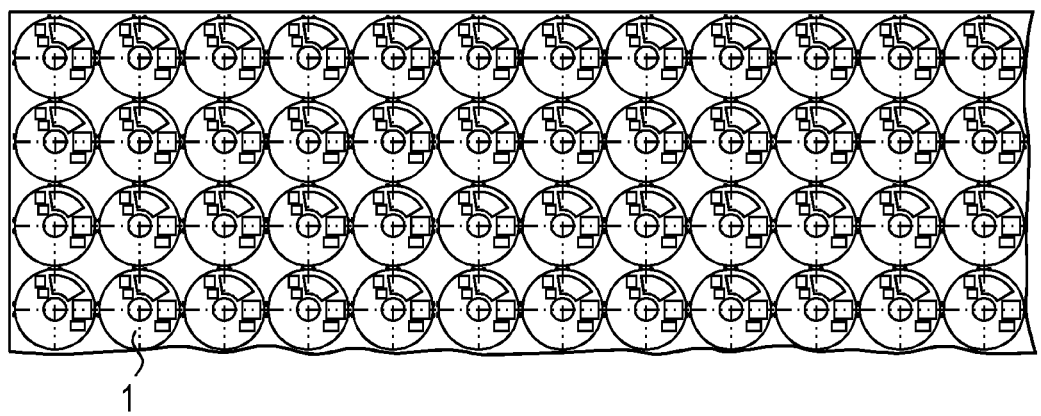
FIG. 1 is a plan view of a metal board with cut-outs, following a first production step of the sensor unit.
Figure 2:
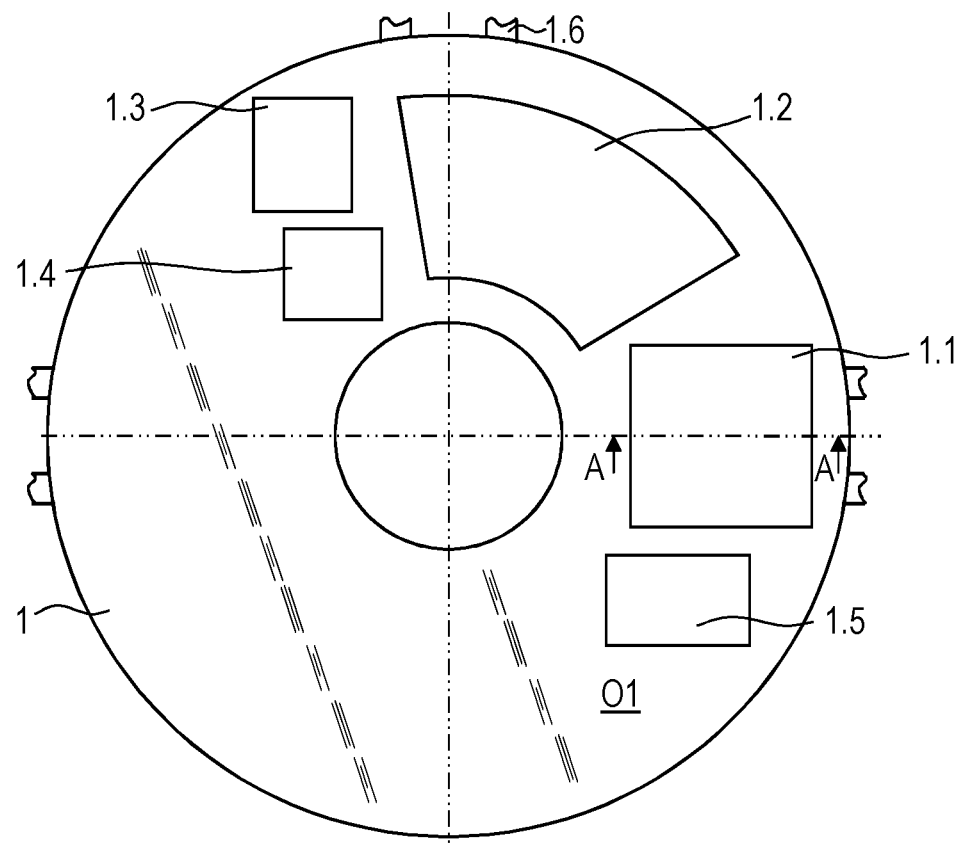
FIG. 2 is a plan view of an individual metal body following the first production step of the sensor unit.

During the production of a sensor unit, a panel or a metal board, which has a thickness of, e.g., 1.0 mm in the exemplary embodiment described herein and which is made of aluminum, is provided to begin with. Cut-out patterns, such as those illustrated in FIG. 1, are then introduced, e.g., using a laser cutting process or a water-jet cutting process. A multitude of metal bodies 1 having a form according to FIG. 2 is produced in this manner. Each metal body 1 consequently has a first opening 1.1, a second opening 1.2, a third opening 1.3, a fourth opening 1.4, and a fifth opening 1.5 as well as a central round opening. An example embodiment of the present invention is described in more detail below, referring more specifically to first opening 1.1 and the cross-sectional views of FIGS. 3a to 3f through line A-A shown in FIG. 2. Following the cutting process, metal bodies 1 are connected to each other by webs 1.6 in this production stage. In alternative production methods, the circular outer contours of metal bodies 1 may also be produced in a later step.

Figure 3A:
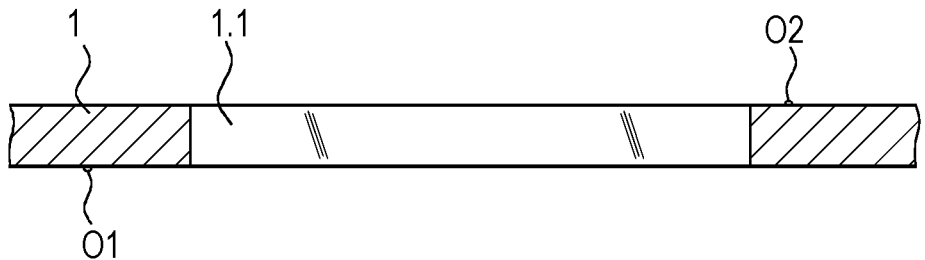
FIG. 3a is a cross-sectional view of a subregion of the sensor unit following the first production step.
Figure 3B:
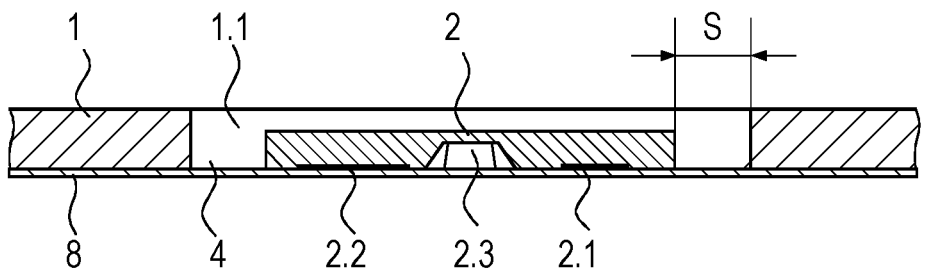
FIG. 3b is a cross-sectional view of the subregion of the sensor unit following a further production step.

According to FIG. 3b, a foil 8 is first bonded or laminated to a first surface O1 of the metal board or metal bodies 1. Next, an electronic component 2 is bonded to foil 8 in first opening 1.1 so that a gap having width S is provided between the edge of first opening 1.1 and component 2. In this exemplary embodiment, component 2 is arranged as an IC chip and includes a first optical sensor 2.1 (e.g., a first photodetector array), and a second optical sensor 2.2 (e.g., a second photodetector array). Component 2 additionally has a light source 2.3, which in this instance is disposed in a cavity of component 2. Component 2 is positioned on foil 8 such that it is arranged flush with first surface O1 in first opening 1.1. In particular, first optical sensor 2.1 and second optical sensor 2.2 are disposed flush with first surface O1 in first opening 1.1.

Figure 3C:
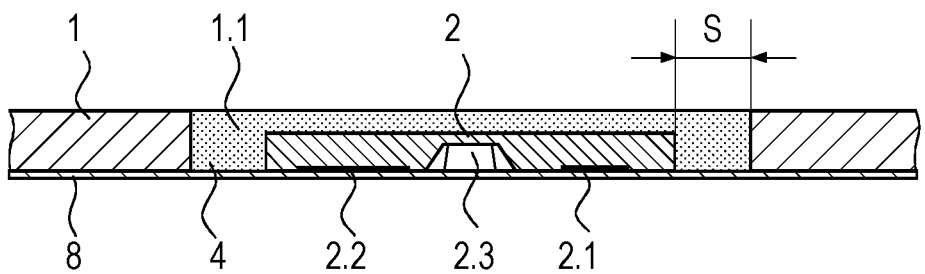
FIG. 3c is a cross-sectional view of the subregion of the sensor unit after a molding compound has been applied.

In the next production step according to FIG. 3c, the volume around component 2 in first opening 1.1 is filled with a molding compound 4. A dispenser or a molding system may be used for the application of molding compound 4 in this context. In this exemplary embodiment, the fixation or bonding of component 2 in conjunction with a careful molding method makes it possible to ensure that no shifting of component 2 occurs relative to metal body 1 during the application of molding compound 4, so that component 2 with its optical sensors 2.1, 2.2 and light source 2.3 is precisely positioned relative to metal body 1.

Foil 8 is removed after the molding and curing of molding mass 4.

Figure 3D:
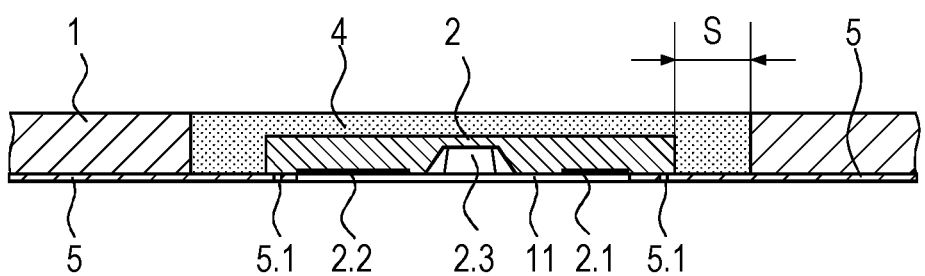
FIG. 3d is a cross-sectional view of the subregion of the sensor unit after an insulating first layer has been applied.

In a next step, an insulating first layer 5, in particular a layer of polyimide, is applied or laminated on first surface O1 of metal body 1 and on the surfaces of molding compound 4 and electronic component 2 that are located flush with the first surface O1 (see FIG. 3d). This first layer 5 is patterned with the aid of a photochemical method such that vias 5.1 are created for circuit traces 6 to be produced in a later step. In the same manner, an opening 11, through which light source 2.3 and optical sensors 2.1, 2.2 are exposed, is produced in first layer 5. As an alternative, especially if a thickness of first layer 5 is small and/or suitable optical properties of first layer 5 are present, it is possible to dispense with the creation of opening 11.

Figure 3E:
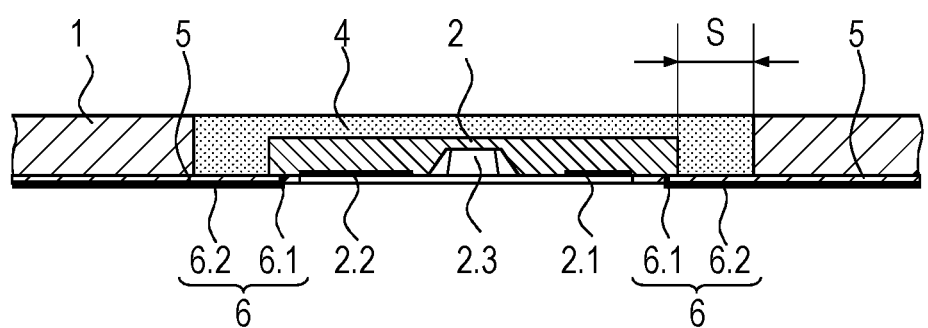
FIG. 3e is a cross-sectional view of the subregion of the sensor unit after circuit traces have been produced.

According to FIG. 3e, a metal layer, which is composed of multiple layers, e.g., two layers, is then applied on first layer 5. This metal layer is processed such that circuit traces 6 according to FIG. 3e are ultimately produced through a selective arrangement of the circuit traces. This effectively produces circuit traces 6 that have a first section 6.1 and a second section 6.2 in each case. In their first section 6.1, circuit traces 6 are routed through first layer 5, especially through vias 5.1. An electrical contact between circuit trace 6 and electronic component 2 is additionally established in the first section. Moreover, in second section 6.2, circuit traces 6 extend parallel to first surface O1 on first layer 5 and are set apart therefrom in accordance with the thickness of first layer 5. An electrically insulating second layer 9, e.g., a passivation layer, is then applied on circuit traces 6.

Optionally, still further layers and further circuit traces may also be produced. The entire layer structure on first surface O1 of metal body 1, e.g., the sum of the thicknesses of the circuit traces and the insulating layers, is, for example, not larger than 0.1 mm, and particularly not larger than 0.05 mm.

Figure 5:
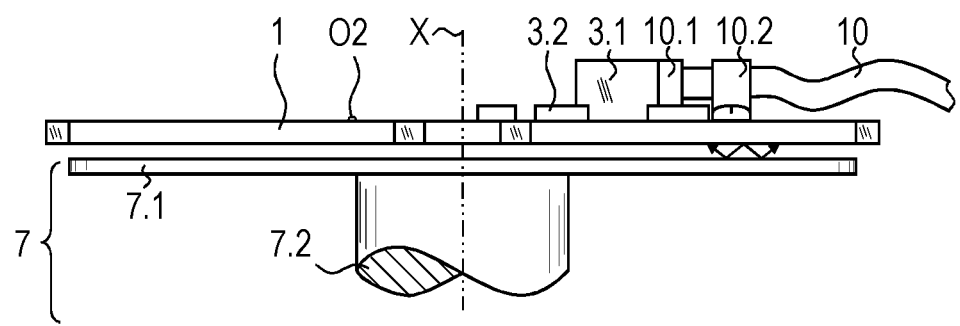
FIG. 5 is a side view of a position-measuring device.

In the course of the production process, the third through fifth openings 1.3 to 1.5 are also fitted with electronic components, in the same manner as first opening 1.1, and are encapsulated and electrically contacted accordingly. A circuit board 3 is positioned and encapsulated in second opening 1.2, the circuit board having a first surface and a second surface that is located opposite from the first surface. Circuit traces 6 are electrically contacted with circuit board 3 at the first surface of circuit board 3, especially with a metallized surface of a via. In addition, for instance, a cable connection 3.1 (in this instance, a plug connector), and further electronic components 3.2 are mounted on the backside, e.g., on the second surface, as illustrated in FIG. 5. Accordingly, further electronic components 3.2 and cable connection 3.1 are provided on a second surface of circuit board 3 that is located opposite from the first surface of circuit board 3. An electrical connection of circuit traces 6 to electronic components 3.2 and/or cable connection 3.1 is achieved with the aid of vias.

Figure 3F:
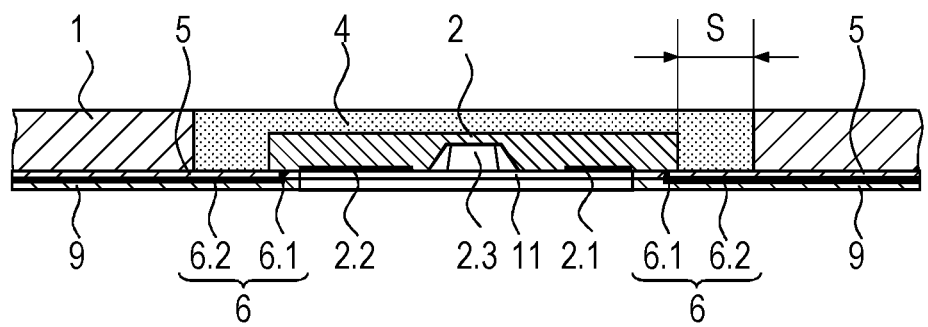
FIG. 3f is a cross-sectional view of the subregion of the sensor unit after a second insulating layer has been applied.

In the illustrated exemplary embodiment, electronic components 3.2 and cable connection 3.1 axially project beyond a second surface O2 of the metal body, and second surface O2 is situated opposite from first surface O1 (see, e.g., FIGS. 3a and 3f).

Figure 4:
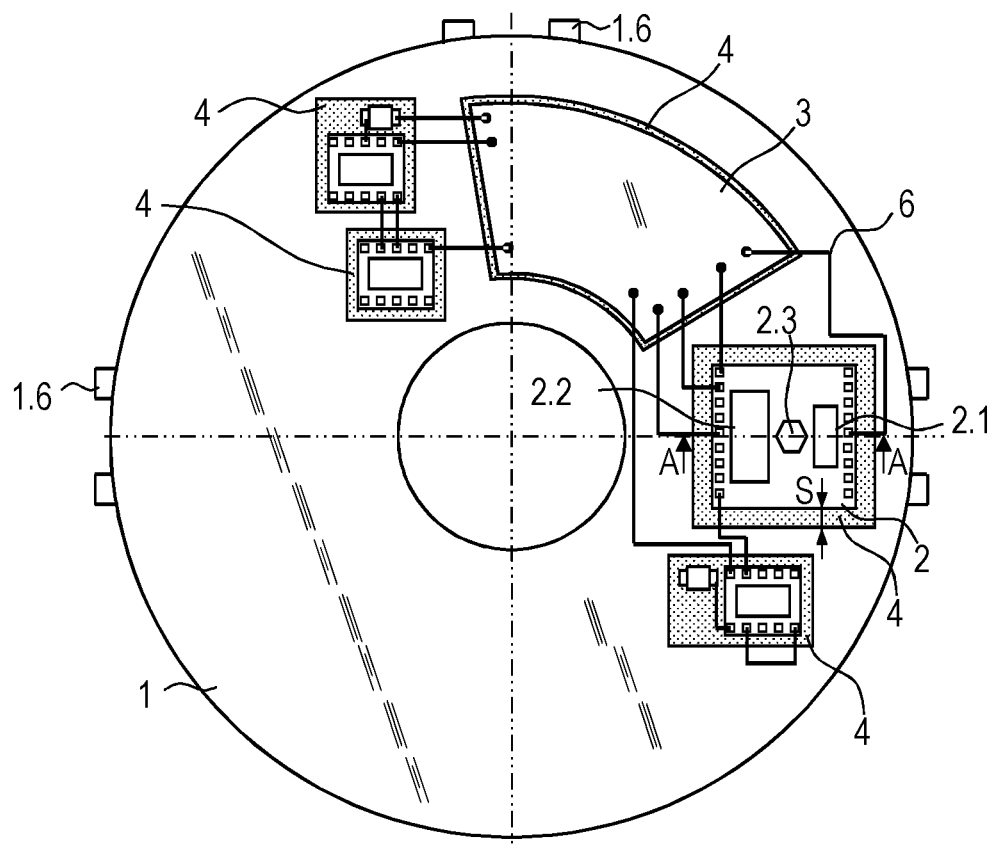
FIG. 4 is a plan view of a sensor unit with installed components.

FIG. 4 is a plan view of the sensor unit that is produced in this manner. Following these production steps, metal bodies 1 may be separated or singulated from one another.

In the further course of the production process, a multicore cable 10, which has a shield (see, e.g., FIG. 5) and a connector 10.1, is connected to cable connection 3.1 of circuit board 3. Furthermore, a clamping piece 10.2 is placed around the shield and fastened to metal body 1 with the aid of the threaded bore in metal body 1 and a screw 2.8. This not only produces a mechanical connection between metal body 1 and cable 10 but also an electrical connection between metal body 1 and the shield.

The backside of the sensor unit according to the system illustrated in FIG. 4 may be injection-molded with an electrically insulating material, for example, so that the second surface of circuit board 3, electronic components 3.2 as well as cable connection 3.1 for the connection of cable 10 are protected from external influences. The injection molding may simultaneously also serve as a traction relief for cable 10.

FIG. 5 is a schematic side view of a measuring system, which includes the sensor unit and a component 7 that is movable in relation to the sensor unit (e.g., the component 7 is rotatable relative to the sensor unit). Component 7 includes a shaft 7.2 and a scale 7.1, which is, for example, an angle scale. Scale 7.1 may include two concentric graduation tracks or code tracks, which are able to be scanned in a reflective manner with the aid of an incident light method.

The sensor unit may be fastened to a machine component such as an engine housing, for example. Metal body 1 may be provided with fastening devices, such as boreholes, for this purpose, which allows for a simple and accurate mounting of the sensor unit. Component 7 or the angle scale usually serves as a rotor and is fastened to a machine component that is rotatable about axis of rotation X. The sensor unit, on the other hand, represents the stator of the position-measuring device, which is arranged as an angle-measuring device, so that it is fixed in place on a stationary machine component. In the assembled state of the position-measuring device, component 7 and the sensor unit are positioned opposite from each other and are separated by a relatively small air gap, the air gap being smaller than schematically illustrated in FIG. 5.

When the measuring system is in operation, light source 2.3 emits light, which is reflected by the graduation tracks of scale 7.1 according to the beam path illustrated in FIG. 5. The light impinges upon optical sensors 2.1, 2.2, which convert the incident light into photocurrents or electrical signals. Axis of rotation X extends through the center of component 7 or scale 7.1. In a relative rotation between component 7 and the sensor unit, a signal as a function of the respective angular position is thereby able to be generated in optical sensors 2.1, 2.2.

The above-described arrangement of the sensor unit makes it possible to provide a system that allows for a precise adjustment of the gap between optical sensors 2.1, 2.2 and scale 7.1 or between light source 2.3 and scale 7.1 in a relatively simple and economical manner. This configuration may ensure that the surface of electronic component 2 facing scale 7.1 is disposed flush with respect to first surface O1 of the metal body. Once the assembly has been completed or metal body 1 has been fixed in place on a machine component, the exact positioning of electronic component 2 relative to metal body 1 ensures a precise positioning of electronic component 2, in particular optical sensors 2.1, 2.2 and light source 2.3.

Component 3.2 mounted on circuit board 3 operates as an evaluation element for the signals. The position values that result from the scanning of the individual graduation tracks are ascertained or calculated in logic circuits on the digital part of component 3.2. The position values are able to be transmitted via cable 10 to a subsequent electronics unit, such as a numerical control of a machine. An angle-measuring device equipped with the sensor unit is therefore used for detecting an angular position between the sensor unit able to be fixed in place on a machine component, and component 7 having scale 7.1.

Alternatively, the component that serves as an evaluation element for the signals may also be disposed without a circuit board in a further opening in metal body 1, surrounded by molding compound 4.

The construction described above provides a sensor unit that is insensitive especially with regard to influences of external electromagnetic fields inasmuch as metal body 1, which is electrically connected in particular to the shield of cable 10, exhibits a shielding effect of its own.

In addition, the heat generated in component 2 is effectively dissipated or distributed to metal body 1 via molding compound 4 so that a reduced operating temperature of electronic component 2 is achieved, which has a positive effect on the measuring accuracy.

What is claimed is:

1. A sensor unit for measuring a position of a component which is movable relative to the sensor unit, comprising:
   a metal body having a first opening;
   an electronic component arranged in the first opening;
   an electrically insulative molding compound filling a gap that is provided between the electronic component and the metal body;
   an electrically insulative first layer applied on the electronic component and on the molding compound; and
   a circuit trace electrically contacting the electronic component, being routed through the first layer in a first section, and extending on the first layer in a second section.

2. The sensor unit according to claim 1, wherein the electrically insulative first layer is also applied on the metal body, and the second section of the circuit trace extends parallel to a first surface of the metal body.

3. The sensor unit according to claim 1, wherein the electronic component includes at least one optical sensor.

4. The sensor unit according to claim 1, wherein the electronic component includes at least one light source.

5. The sensor unit according to claim 1, wherein the electronic component includes at least one magnetic sensor.

6. The sensor unit according to claim 1, wherein the metal body includes a first surface, and the electronic component is arranged flush with the first surface in the first opening.

7. The sensor unit according to claim 1, wherein the electronic component includes at least one optical sensor, the metal body having a first surface, the at least one optical sensor disposed flush with the first surface.

8. The sensor unit according to claim 1, wherein the metal body includes a first surface and a second surface, the second surface being located opposite the first surface, the sensor unit including at least one electronic component projecting beyond the second surface.

9. The sensor unit according to claim 1, wherein the metal body includes a second opening, a circuit board being arranged in the second opening and including a first surface and a second surface located opposite the first surface, the circuit trace electrically contacting the circuit board at the first surface of the circuit board, an electronic component being mounted on the second surface of the circuit board, the circuit trace electrically connected to the component with the aid of a via.

10. The sensor unit according to claim 1, further comprising a cable that includes a shield, shield being electrically connected to the metal body.

11. The sensor unit according to claim 1, wherein the metal body includes a first surface and a second surface located opposite the first surface, the sensor unit including at least one cable connection projecting beyond the second surface.

12. The sensor unit according to claim 1, wherein the metal body has a thickness of more than 0.5 mm.

13. The sensor unit according to claim 1, wherein the circuit trace electrically contacts the electronic component at the first section.

14. The sensor unit according to claim 1, wherein the circuit trace electrically contacts the electronic component at a location at which the circuit trace is routed through the first layer.

15. A position-measuring device, comprising:
   a component including a scale;
   a sensor unit arranged opposite the scale, the component being movable relative to the sensor unit, the sensor unit adapted to measure a position of the component relative to the sensor unit and including:
      a metal body having a first opening;
      an electronic component arranged in the first opening;
      an electrically insulative molding compound filling a gap that is provided between the electronic component and the metal body;
      an electrically insulative first layer applied on the electronic component and on the molding compound; and
      a circuit trace electrically contacting the electronic component, being routed through the first layer in a first section, and extending on the first layer in a second section;
   wherein the circuit trace is arranged between the metal body and the scale.

16. The position-measuring device according to claim 15, wherein the component is rotatable relative to the sensor unit, and the scale is arranged as an angle scale.

17. The position-measuring device according to claim 15, wherein the component is linearly displaceable relative to the sensor unit, and the scale is arranged as a linear scale.

18. The position-measuring device according to claim 15, wherein the circuit trace electrically contacts the electronic component at the first section.

19. The position-measuring device according to claim 15, wherein the circuit trace electrically contacts the electronic component at a location at which the circuit trace is routed through the first layer.

* * * * *